(12) United States Patent
Hutton et al.

(10) Patent No.: US 7,577,929 B1
(45) Date of Patent: Aug. 18, 2009

(54) EARLY TIMING ESTIMATION OF TIMING STATISTICAL PROPERTIES OF PLACEMENT

(75) Inventors: Michael D. Hutton, San Francisco, CA (US); David Karchmer, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 407 days.

(21) Appl. No.: 11/187,722

(22) Filed: Jul. 21, 2005

(51) Int. Cl.
 *G06F 17/50* (2006.01)
 *G06F 9/45* (2006.01)
 *H03K 17/693* (2006.01)

(52) U.S. Cl. .................. 716/5; 716/2; 716/3; 716/16

(58) Field of Classification Search ............... 716/2–3, 716/16, 5
 See application file for complete search history.

(56) References Cited

U.S. PATENT DOCUMENTS

| | | | |
|---|---|---|---|
| 6,215,326 | B1 | 4/2001 | Jefferson et al. |
| 6,407,576 | B1 | 6/2002 | Ngai et al. |
| 7,328,420 | B1* | 2/2008 | Datta et al. ................ 716/11 |
| 2005/0204316 | A1* | 9/2005 | Nebel et al. ................ 716/2 |
| 2005/0204325 | A1* | 9/2005 | Fung et al. ................ 716/16 |
| 2006/0010415 | A1* | 1/2006 | Curtin et al. .............. 716/10 |
| 2006/0015829 | A1* | 1/2006 | De Smedt et al. ........... 716/2 |

OTHER PUBLICATIONS

Hutton, Michael, et al., "Adaptive Delay Estimation for Partitioning-Driven PLD Placement," *IEEE Transactions on Very Large Scale Integration (VLSI) Systems*, (2002) vol. XX, No. Y, pp. 100-104.

Hutton, Michael, "Interconnect Prediction for Programmable Logic Devices," *Altera Corporation*, 101 Innovation Drive, San Jose, CA 95134, (Mar. 2001) pp. 1-7.

Hutton, Michael D., et al., "Characterization and Parameterized Generation of Synthetic Combinational Benchmark Circuits," *IEEE Transactions on Computer-Aided Design of Integrated Circuits and Systems*, (1999) vol. XX, No. Y, pp. 1-12.

Hutton, Mike, et al., "Improving FPGA Performance and Area Using an Adaptive Logic Module," J. Becker, M. Platzner, S. Verndale (Eds.), (2004) pp. 135-144.

(Continued)

*Primary Examiner*—Jack Chiang
*Assistant Examiner*—Suresh Memula
(74) *Attorney, Agent, or Firm*—Townsend and Townsend and Crew LLP

(57) ABSTRACT

A performance estimation module estimates the performance values of user designs in early phases of compilation and accounts for the performance variability introduced by subsequent compilation phases. The user design is parameterized. The performance estimation model outputs a probability distribution function of estimated performance values of the user design, based upon this parameterization. The performance estimation model is created by parameterizing sample designs. The sample designs are compiled and analyzed to determine their performance values. To account for random variability in compilation phases, the module compiles and analyzes sample designs multiple times. The performance estimation model is created from the relationship between sample designs' performance values and their parameterizations. A regression analysis may be used to determine this relationship. The performance estimation model can be updated with the analysis of compiled user designs. The performance values can include timing, power, and resource consumption.

26 Claims, 7 Drawing Sheets

OTHER PUBLICATIONS

Hutton, Michael D., "Characterization and Parameterized Generation of Digital Circuits," A thesis submitted in conformity with the requirements for the Degree of Doctor of Philosophy in the Graduate Department of Computer Science, University of Toronto (1997).

Keutzer, Kurt, "DAGON: Technology Binding and Local Optimization," *AT&T Bell Laboratories*, Murray Hill, New Jersey 07974, (1987) 24th ACM/IEEE Design Automation Conference.

Lewis, David, et al., "The Stratix™ Routing and Logic Architecture," *Altera Corporation*, 101 Innovation Drive, San Jose, CA 95134, (2003).

Pistorius, Joachim, et al., "Placement Rent Exponent Calculation Methods, Temporal Behaviour and FPGA Architecture Evaluation," *Altera Corporation*, 101 Innovation Drive, San Jose, CA 95134, (2003).

Visweswariah, Chandu, "Death, Taxes and Failing Chips," *IBM Thomas J. Watson Research Center*, 1101 Kitchawan Road, Route 134, Yorktown Heights, NY 10598 (2003).

Visweswariah, C., et al., "First-Order Incremental Block-Based Statisitcal Timing Analysis," *IBM Research, T.J. Watson Research Center*, Yorktown Heights, NY, *Department of EECS, University of California*, Berkeley, CA *and IBM Microelectronics*, East Fishkill, NY & Burlington, VT, (2004).

\* cited by examiner

EARLY TIMING ESTIMATION OF TIMING STATISTICAL PROPERTIES OF PLACEMENT

BACKGROUND

The present invention relates to the field of programmable devices, and the systems and methods for programming the same. Programmable devices, such as FPGAs, typically includes thousands of programmable logic cells that use combinations of logic gates and/or look-up tables to perform a logic operation. Programmable devices also include a number of functional blocks having specialized logic devices adapted to a specific logic operations. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

A typical design cycle for determining the configuration of a programmable device, referred to compilation, starts with an extraction phase, followed by a logic synthesis phase, a fitting phase, and an assembly phase. The extraction phase takes a user design, typically expressed as a netlist in a hardware description language such as Verilog or VHDL, and produces a set of logic gates implementing the user design. In the logic synthesis phase, the set of logic gates is permuted over the hardware architecture of the programmable device in order to match elements of the user design with corresponding portions of the programmable device. The fitting phase assigns the various portions of the user design to specific logic cells and functional blocks and determines the configuration of the configurable switching circuit used to route signals between these logic cells and functional blocks, taking care to satisfy the user timing constraints as much as possible. In the assembly phase, a configuration file defining the programmable device configuration is created. The configuration can then be loaded into a programmable device to implement the user design.

In addition to implementing their desired functions, user designs typically must satisfy one or more additional design goals, such as operating speed, power consumption, and/or programmable device resource consumption. One or more compilation phases often optimize the user design during compilation to achieve these design goals. Generally, optimization of a user design requires choosing one configuration of the user design from numerous possible alternative configurations. To choose the optimal configuration of the user design, the compilation phase generally must identify potential problem areas of the user design to predict how well a given configuration of a user design satisfies its design goals.

For compilation phases at the beginning of the compilation process, identifying problem areas of the user design is difficult. Many portions of the configuration that will greatly affect the overall performance of the user design are determined by subsequent compilation phases. Thus, the earlier compilation phases must try to predict the likely results of subsequent compilation phases to determine the portions of the user design that require optimizations and the types of optimizations required for these portions. This prediction is often difficult and time-consuming. Furthermore, many compilation phases have a large degree of random variability in their output, making accurate predictions of the behavior even more difficult. As a result, the earlier compilation phases often determine a less than optimal configuration of the user design, which forces the later compilation phases to perform additional optimizations to satisfy the design goals of the user design. Alternatively, the user design can be recompiled using information from a previous compilation to apply more suitable optimizations in an early compilation phase. However, the random variability of subsequent compilation phases often renders these optimizations moot. As a result, these approaches are very time-consuming and often provide unsatisfactory results.

It is therefore desirable for a system and method to provide improved estimates of the performance of the user design following subsequent compilation phases. It is further desirable for the estimates of the user design performance to account for the random variability of subsequent compilation phases. It is also desirable for the system and method to integrate easily with existing compilation phases.

BRIEF SUMMARY

A performance estimation module estimates the performance values of user designs in early phases of compilation and accounts for the performance variability introduced by subsequent compilation phases. The user design is parameterized. The performance estimation model outputs a probability distribution function of estimated performance values of the user design, based upon this parameterization. The performance estimation model is created by parameterizing sample designs. The sample designs are compiled and analyzed to determine their performance values. To account for random variability in compilation phases, the module compiles and analyzes sample designs multiple times. The performance estimation model is created from the relationship between sample designs' performance values and their parameterizations. A regression analysis may be used to determine this relationship. The performance estimation model can be updated with the analysis of compiled user designs. The performance values can include timing, power, and resource consumption.

BRIEF DESCRIPTION OF THE DRAWINGS

The invention will be described with reference to the drawings, in which.

DETAILED DESCRIPTION

Figure 1:
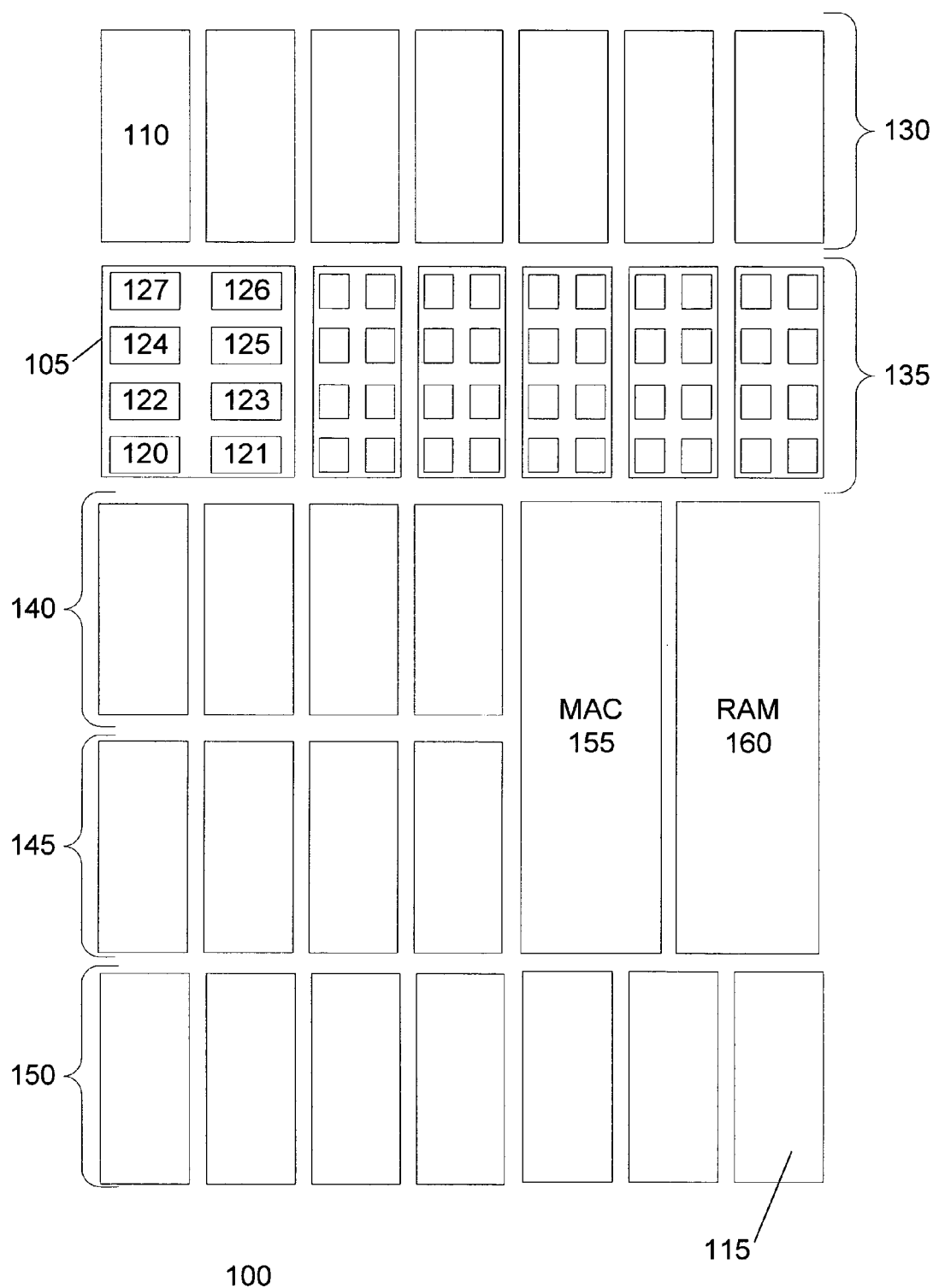
FIG. 1 illustrates a portion of an example programmable device suitable for use with an embodiment of the invention.

FIG. 1 illustrates a portion of an example programmable device 100 suitable for use with an embodiment of the invention. Programmable device 100 includes a number of logic array blocks (LABs), such as LABs 105, 110, 115. Each LAB includes a number of programmable logic cells using logic gates and/or look-up tables to perform a logic operation. LAB 105 illustrates in detail logic cells 120, 121, 122, 123, 124, 125, 126, and 127. LAB 105 is enlarged in FIG. 1 for the purposes of illustration; similarly, the logic cells are omitted from other LABs in FIG. 1 for clarity. In typical programmable devices, all logic array blocks are similarly sized and include a similar number and arrangement of logic cells and/or other components. The LABs of device 100 are arranged into rows 130, 135, 140, 145, and 150. In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently. Alternatively, the configurable connections between logic cells can have a staggered arrangement. Regardless of the arrangement of configurable connections, identically functioning connections can have different delay or power characteristics. In addition to logic cells arranged in LABs, programmable device 100 also include specialized functional blocks, such as multiply and accumulate block (MAC) 155 and random access memory block (RAM) 160. For clarity, the portion of the programmable device 100 shown in FIG. 1 only includes a small number of logic cells, LABs, and functional blocks. Typical programmable devices will include thousands or tens of thousands of these elements.

Figure 2:
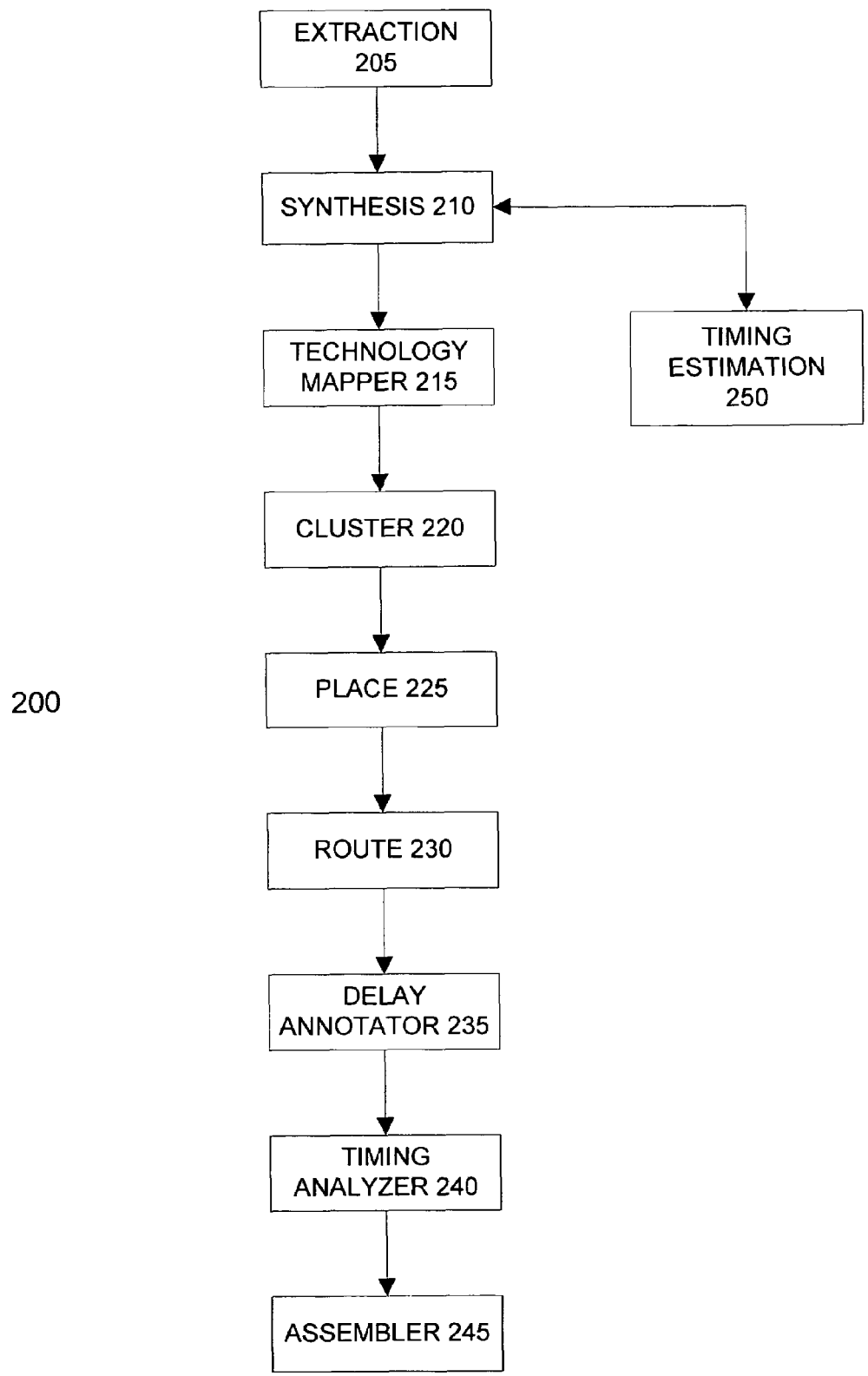
FIG. 2 illustrates the phases of a typical compilation process suitable for implementing an embodiment of the invention.

FIG. 2 illustrates the phases of a typical compilation 200 process suitable for implementing an embodiment of the invention. The compilation process 200 converts a user design into a programmable device configuration adapted to configure a programmable device to implement the user design. The extraction phase 205 converts a description of the user design, expressed for example in a hardware description language, into a register transfer layer description.

Synthesis phase 210 converts the register transfer layer description of the user design into a set of logic gates. Technology mapping phase 215 subdivides the set of logic gates into a set of atoms, which are groups of logic gates matching the capabilities of the logic cells or other functional blocks of the programmable device. Alternatively, atoms can correspond with the components of other types of device architectures, such as ASIC gates or adaptive logic modules. A given user design may be converted into any number of different sets of atoms, depending upon the underlying hardware of the device used to implement the user design.

Following the technology mapping phase 215, the cluster phase 220 groups related atoms together into clusters. The place phase 225 assigns clusters of atoms to locations on the programmable device. The route phase 230 determines the configuration of the configurable switching circuit of the programmable device used to connect the atoms implementing the user design.

The delay annotator phase 235 determines the signal delays for the set of atoms and their associated connections in the configurable switching circuit using a timing model of the programmable device. The timing analysis phase 240 determines the maximum operating speed of the programmable device when implementing the user design, for example by determining the portions of the user design have the largest signal delay.

The assembler phase 245 generates a set of configuration information specifying the configuration of the programmable device implementing the user design, including the configuration of each of the logic cells used to implement the user design and the configuration of the configurable switching circuit used to connect the logic cells. The assembler phase 245 can write the configuration information to a configuration file, which can then be used to configure one or more programmable devices to implement instances of the user design.

One or more compilation phases often optimize the user design during compilation to achieve design goals such as operating speed, power consumption, and/or programmable device resource consumption. Often optimizations for different design goals conflict. Thus, compilations phases attempt to determine compromise configurations that satisfy all design goals. For example, a timing design goal may assign certain timing constraints on one or more paths of the user design. A delay critical path is a path that exceeds or has a small difference, relative to the other paths of the user design, between its actual timing performance and its assigned timing constraints. A compilation phase may optimize delay critical portions of the design for speed, at the expense of device resource consumption, and optimize the non-delay critical portions for power or resource consumption, at the expense of speed.

To effectively optimize different portions of a user design to satisfy different design goals, compilation phases must identify the portions of the user design that are critical for each design goal. Because many portions of the configuration of a user design that greatly affect the overall performance of the user design are determined by subsequent compilation phases, compilation phases early in the compilation process must estimate the criticality of portions of the user design with respect to the design goals.

For example, the synthesis phase needs to estimate which connections, or edges, between logic gates of the user design are delay-critical. Simple estimates, such as the unit delay of a path, which is the number of logic gates, or nodes, connected by edges in series to source and destination registers, are not accurate enough for many optimization techniques, because delay is greatly influenced by the length of edges, which is determined by the subsequent placement phase. In some implementations, a timing estimation module 250 provides early phases of the compilation, such as synthesis, an estimate of the performance of the user design following subsequent compilation phases, such as placement. For example, the timing estimation module 250 can receive information about the user design from the synthesis phase 210 and provide the synthesis phase 210 with estimated timing information for one or more paths of the user design. Using this estimated timing information, the synthesis phase 210 can optimize the delay critical paths of the user design to satisfy timing design goals and the other portions of the user design to meet other design goals.

Unfortunately, many compilation phases have a large degree of random variability. This can occur when a compilation phase uses optimization techniques that evaluate randomly or pseudo-randomly generated alternative configurations of the user design to find a locally optimal configuration. For example, the placement phase may use simulated annealing to determine an optimal placement configuration of the user design. With these types of optimization techniques, the output of the compilation phase may vary greatly depending on the initial random seed value; furthermore, even if the random seed remains constant, relatively small changes in the user design in previous compilation phases can result in vastly different outputs from the subsequent phases of the user design. This random variability makes accurately estimating the criticality of portions of the user design more difficult.

To address this, an embodiment of the invention provides a statistical model to estimate the performance of the user design that accounts for the random variability of the output of subsequent compilation phases. This statistical model can be used during an early compilation phase, such as a synthesis phase, to provide an estimated set of values or range of values of the performance characteristics of the user design following a subsequent compilation phase, such as placement. Using these estimated values, the earlier compilation phase can optimize the user design to meet all of the design goals. This optimization may be performed iteratively, with the early compilation phase repeatedly evaluating the estimated performance characteristics of many alternative configurations of the user design until all portions of the user design meet the user's design goals.

As discussed in detail below, an embodiment of the statistical model provides estimated performance values in the form of one or more probability distribution functions that express the range and relative probability of performance values for the user design. Probability distribution functions of performance value can be determined for different portions of the user design, such as individual nodes, edges, and paths. For example, the compilation phase can then evaluate the probability distribution functions of one or more edges and/or nodes to determine a combined probability distribution function of an entire path. The compilation phase can then optimize the paths of the user design so that their respective probability distribution functions fall wholly or partially within the constraints set by the user's design goals.

Figure 3:
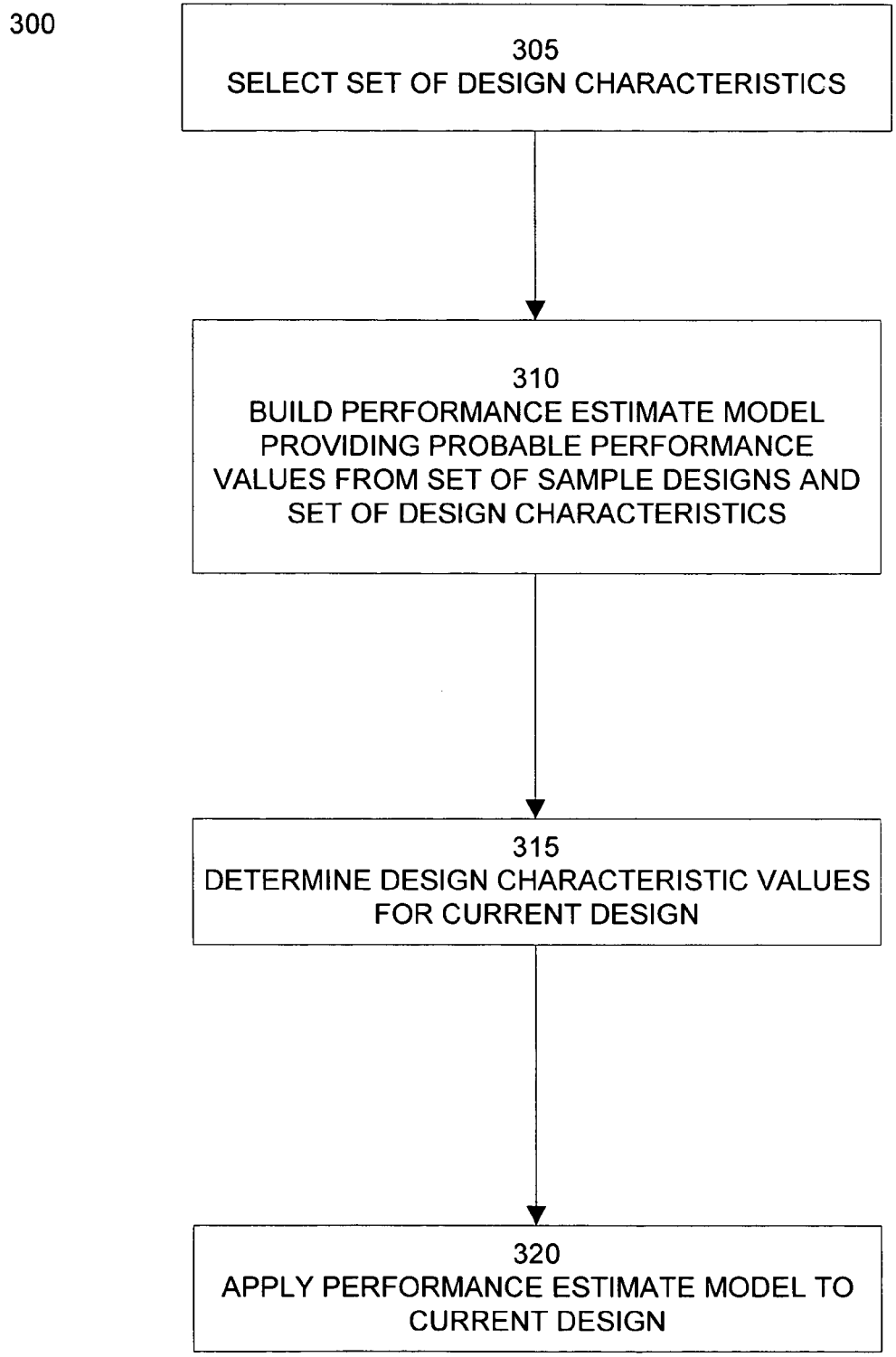
FIG. 3 is a flowchart illustrating a method for estimating the performance of a user design according to an embodiment of the invention.

FIG. 3 is a flowchart illustrating an example method 300 for estimating the performance of a user design according to an embodiment of the invention. Step 305 selects a set of design characteristics to be used to classify user designs. Design characteristics can be attributes of the user design as a whole as well as attributes of individual paths, edges, and nodes. Examples of design characteristics include: the size of user design, such as the number of nodes, edges, or paths; the number of clock signals and the number of nodes in each clock domain; the fan-ins and fan-outs of individual nodes; unit delays of paths; the maximum unit delay of all paths including a given edge; edge attributes such as whether the edge is associated with a clock or data signal; the Rent parameter of the user design, which is a common measure of circuit complexity; the type of node at the beginning or end of a path, such as a logic cell, adder, or memory unit; the number and type of functional blocks used by the user design; the number and types of IP blocks in the user design; and the number and types of inputs and outputs.

Additional example design characteristics include: the combinational shape of the user design, which is an array or vector describing the number of nodes at a given unit delay level; the sequential shape, which is analogous to the combinatorial shape, but measuring unit distance in the number of registers, rather than combinational nodes; the edge-length, which is a vector or array describing the number of edges of at a given length "k", meaning between two nodes at delay levels differing by k; the fan-out distribution, which is a vector or array describing the number of nodes with given fan-out values; the average fan-out; the locality of the user design, which is a heuristic calculation of local structure in a circuit using spread (x-y distance in a layout of two adjacent nodes), and wire length (overall spread among all nodes); the crossing number, which is the number of edge-crossings in a plane diagram of the circuit; the reconvergence, which is a quantification of graph-theoretic reconvergence, defined by the number of spanning out-trees in the graph; the span of a node, which is the number of nodes of distance k from a given node; the local density, which is a metric of span of a node that includes secondary effects of neighboring nodes; the mutual contraction; and the total edge-slack in the network (sum of the edge-length vector from indices 2 . . . n).

The type of user design can be a design characteristic as well. The type of user design, for example a wireless communications design, a networking design, or a control system design, can be determined by comparing the values of design characteristics of the user design with the values of design characteristics of typical designs of each type. Alternatively, the designer can manually specify the type to be associated with the user design.

Step 310 builds a performance estimate model from a set of sample designs and the selected set of design characteristics. The details of step 310 will be discussed in detail below. In a general embodiment, each of a set of sample designs is classified according to the set of design characteristics. This classification includes determining the value of each of the set of design characteristics for the user design as a whole, and its nodes, edges, and paths as applicable. The set of sample designs are compiled and analyzed at least once using standard compilation and analysis techniques to determine performance values, such as timing delay values, power consumption values, or device resource usage for the user design and its nodes, edges, and paths, as applicable. The sample designs' design characteristic values and corresponding performance values are used to build a statistical model for estimating the performance values of user designs having similar design characteristic values following a subsequent compilation phase. In an embodiment, the performance estimate model provides the probable value or range of values of the performance characteristic of the nodes, edges and paths of the user design. In an embodiment, the probable value or range of values of performance characteristics are expressed as probability distribution functions. As discussed above, this model can be employed by an earlier compilation phase to estimate the performance values of a user design and optimize the user design appropriately.

An embodiment of steps 305 and 310 can include a large number of different sample designs compiled and analyzed numerous times to account for the random variability of compilation phases. For example, step 310 can compile and analyze hundreds of different user designs tens or hundreds of times each. Although step 310 may be time-consuming, in an embodiment steps 305 and 310 are done in advance of any compilation of the user design. Furthermore, the results of step 310, the performance estimate model, can be saved and re-used during the compilation of any number of user designs.

Step 315 determines the values of a set of design characteristics for a user design. In an embodiment, the set of design characteristics used to classify the user design is the same as that used to classify each of the set of sample designs. In another embodiment, step 315 estimates the value of one or more design characteristics to save time, rather than determining its exact value. For example, the Rent's parameter of a user design can be time consuming to determine, so an embodiment of the invention can estimate the value of this parameter instead. In another embodiment, step 315 uses one or more different design characteristics to classify the user design in place of the value of a corresponding design characteristic used to classify the set of sample designs.

Step 320 applies the performance estimate model to the user design to estimate the performance values of the user design and its nodes, edges, and paths. In an embodiment, the set of design characteristics are inputs to one or more functions that output one or more performance values. In a further embodiment, the set of design characteristics are used as indices to access performance values stored in an array or database. In a further embodiment, a probability distribution function of performance values is associated with each of at least a portion of the set of all possible design characteristic values. In additional embodiment, functions such as interpolation can be used to derive a probability distribution function of performance values for a given set of values of design characteristics from one or more other probability distribution functions associated with other sets of values of design characteristics.

Figure 7:
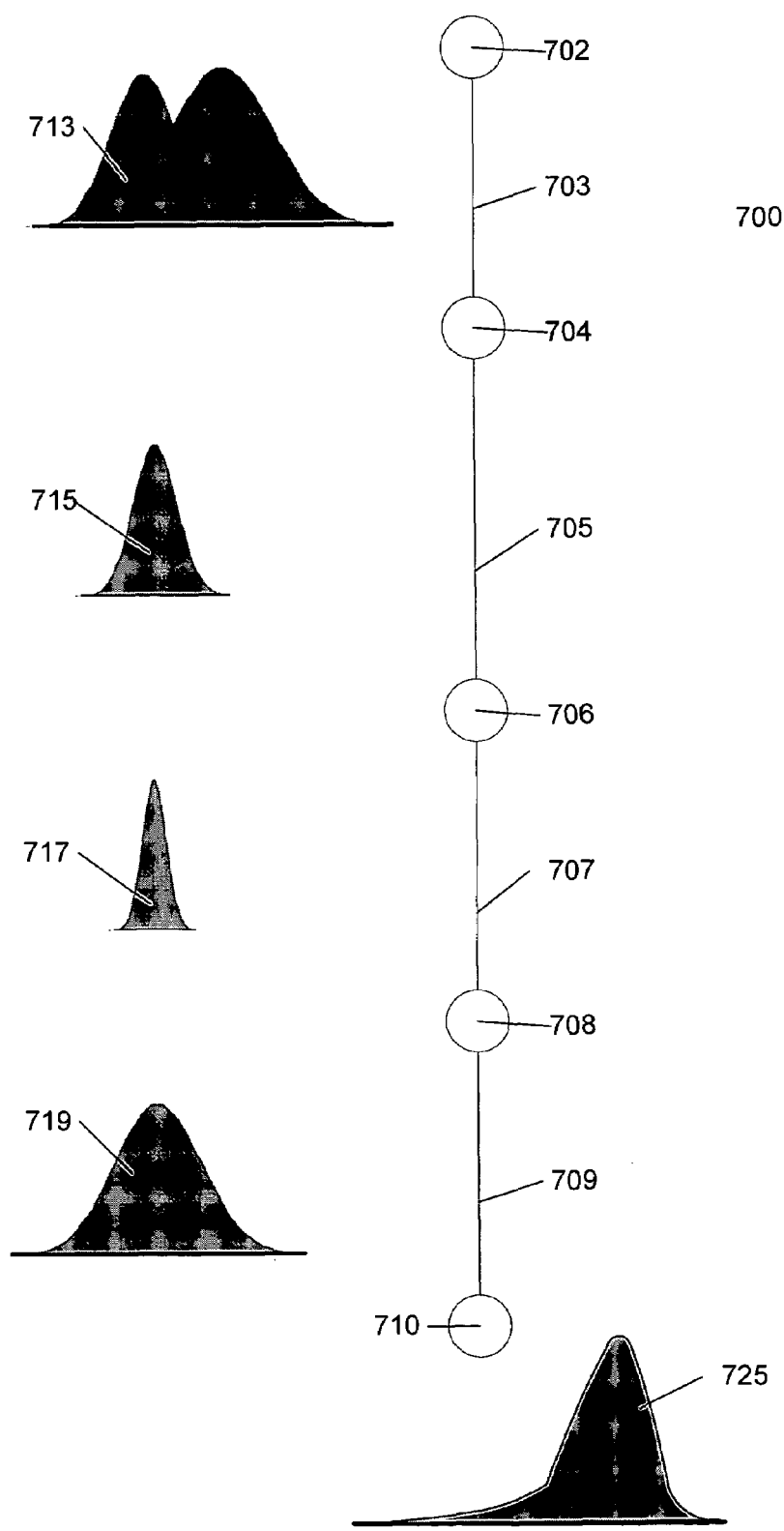
FIG. 7 illustrates an example application of a performance model to a portion of an example user design according to an embodiment of the invention.

FIG. 7 illustrates an example application of a performance estimate model to a portion of an example user design according to an embodiment of the invention. The portion of the user design includes nodes 702, 704, 706, 708, and 710. These nodes are connected together by edges 703, 705, 707, and 709, forming a path 700. Applying an embodiment of the performance estimate model to the path 700 as described above, an embodiment of step 320 determines a probability distribution function for each edge along the example path 700 based on the design characteristics of the user design. In this example, probability distribution functions 713, 715, 717, and 719 are associated with edges 703, 705, 707, and 709, respectively. As can be seen in FIG. 7, probability distribution functions can assume a variety of forms, reflecting any potential range and probability of performance values associated with an edge. As discussed in detail below, probability distribution functions can be expressed in a number of different formats, such as an analytic function, a mean and standard deviation, a piece-wise linear function, or any other form known in the art for representing probability distributions.

The performance values of the user design can then be used by a compilation phase to allocate the appropriate type and amount of optimization effort for the portions of the user design. In an embodiment, all or a portion of method 300 is built into a compilation phase. Alternatively, method 300 can be utilized by any type of compilation phase that accepts performance value data from an external module. In a further embodiment, the compilation phase supplies an external module either with a user design or the values of the set of design characteristics for all or a portion of the user design. The external module then returns the corresponding estimated performance values. Although method 300 is described with reference to a single type of performance value to be used by a single compilation phase, steps 305 and 310 can be used to create multiple performance estimate models for different design goals, either with the same or different sets of design characteristics. Similarly, steps 315 and 320 can apply multiple performance estimate models to estimate one or more performance values in one or more compilation phases.

Returning to the example of FIG. 7, embodiments of a compilation phase combine performance estimate values for portions of path to determine performance estimate values for the entire path 700. For example, by combining the probability distribution functions 713, 715, 717, and 719, a new probability distribution function 725 can be created that represents the performance estimate values and associated probabilities for the path 700. After repeating this computation for the other paths of the user design, the compilation phase can optimize paths to ensure that their respective probability distribution functions fall at least partially within the constraints set by the design goals. In a further embodiment, the compilation phase will tolerate paths with probability distribution functions partially outside of the path's constraints provided the probabilities associated with the out of constraint performance values are relatively small.

Users typically create designs that are similar in function and other characteristics. In a further embodiment, as user designs are processed by method 300, their design characteristics and resulting performance values at the end of compilation are used to modify one or more performance estimate models. The user design's design characteristics and performance estimate values are included with the design characteristics and performance estimate values of the sample designs and processed in steps 305 and 310 and/or method 400, discussed below. In this manner, the performance estimate models determined from a set of general sample designs becomes tailored to each user's typical designs.

Figure 4:
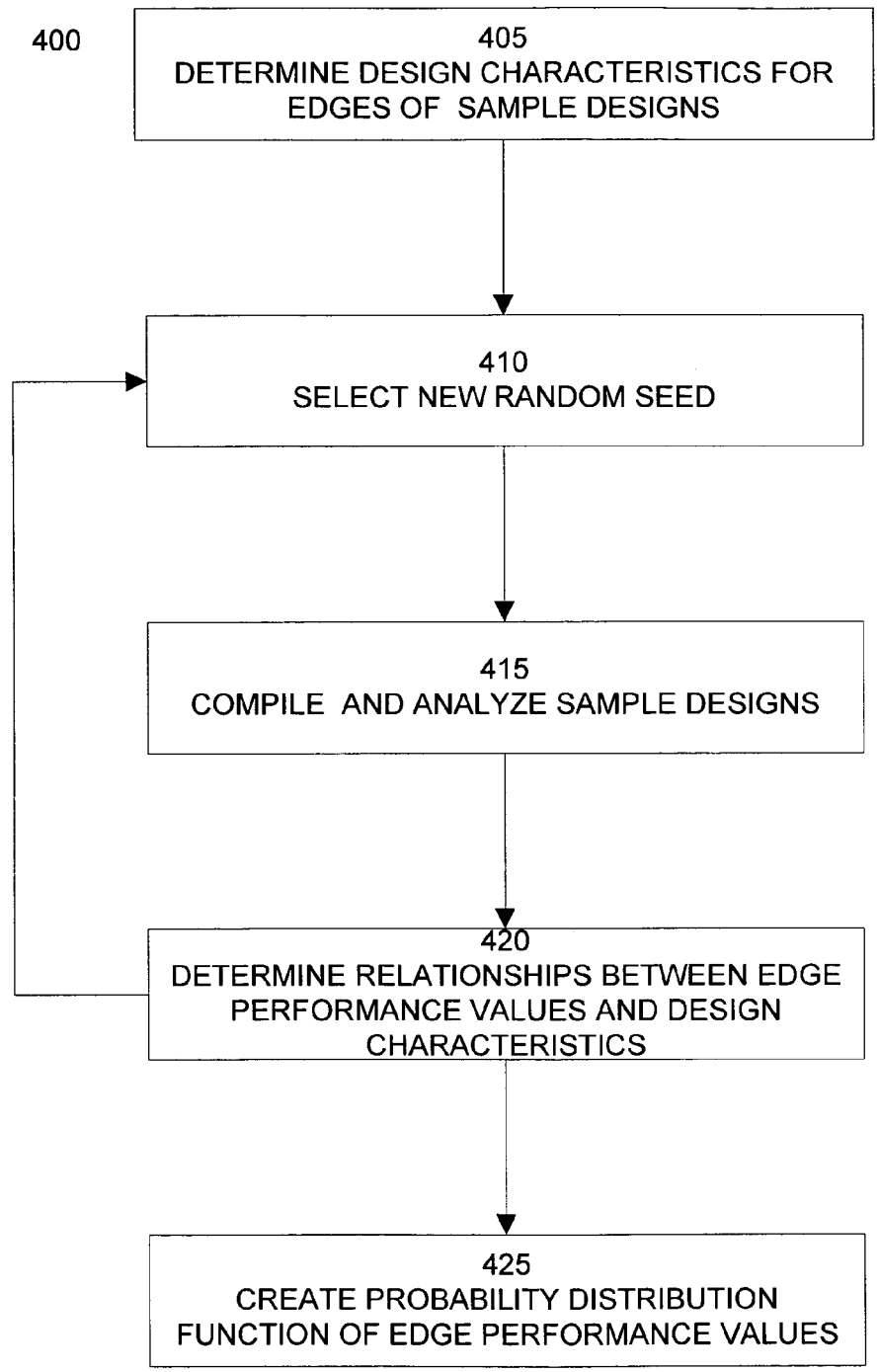
FIG. 4 is a flowchart illustrating a method for creating a performance model used to estimate the performance of user designs according to an embodiment of the invention.

FIG. 4 is a flowchart illustrating a method 400 for creating a performance model used to estimate the performance of user designs according to an embodiment of the invention. Method 400 can be used by an embodiment of step 310, discussed above. Step 405 determines the values of one or more selected design characteristics for each edge of each of a set of sample designs. Some design characteristic values may pertain the design as a whole, and thus remain the same for each edge of a sample design. Similarly, design characteristic values may pertain to a path in a design, and thus remain the same for all edges in a path of a sample design. Other design characteristics values pertain an edge in a design, and thus may change from edge to edge in a sample design.

Step 410 selects a new random number generator seed value. Many compilation phases use randomness to optimize designs. As discussed in detail below, to ensure that the performance estimate model accounts for the random variability of subsequent compilation phases, sample designs are compiled several times with different random number generator seed values. Using different seed values ensures that performance values reflect the randomness (or pseudo-randomness) of subsequent compilation phases. In an alternate embodiment, step 410 can be bypassed if subsequent compilation phases exhibit truly random, as opposed to pseudo-random, behavior, or if they automatically select different random seed values. In further embodiments, if the subsequent phase can use alternate algorithms or use one or more optimization parameters, step 410 can randomly or pseudo-randomly select an algorithm or optimization parameter values.

Step 415 compiles and analyzes the set of sample designs to determine the performance values of the edges of the set of sample designs. In an embodiment, step 415 is performed as described above with respect to method 200. An association between the edges prior to step 415 and following compilation and analysis is maintained so that performance values can be associated with their edges.

Step 420 determines relationships between the values of design characteristics for edges and their corresponding performance values. In an embodiment, a statistical regression analysis technique is used to define these relationships. For example, the set of design characteristics and resulting performance value for each edge of each sample design are treated as sample points, and any standard linear or non-linear regression analysis technique can be used to determine the parameters of a line or curve that best fits the entire set of sample points. In an embodiment, this relationship is expressed as a probability distribution function and can be represented analytically, as a piece-wise linear distribution, as a mean and standard deviation (assuming the distribution is Gaussian), or any other form known in the art for representing statistical data.

Many compilation phases exhibit a high degree of random variability in their outputs. For example, simulated annealing, which is a common optimization technique, determines an initial configuration of a user design randomly. The technique then randomly changes portions of the configuration. The performance of the new configuration is compared with that of the prior configuration. The changed configuration is kept if it offers improved performance and discarded in favor of the prior configuration if it does not. This process of random changes and evaluation is then repeated to reach a configuration with a local maximum performance. Other optimization techniques also incorporate randomness. To insure that the performance estimate model accounts for the random variability of subsequent compilation techniques, sample designs are compiled and analyzed several times with different random number generator seed values. Thus, following step 420, steps 410 through 420 are repeated until a statistically accurate sample of performance values is determined. In an embodiment of step 425, the results of two or more evaluations of the set of sample designs are combined so that the relationships between design characteristics and edge performance values are expressed as probability distribution functions. In a further embodiment, the probability distribution functions are expressed as sets of discrete sample values. Alternatively, the mean and standard deviation of performance values, or any other statistical values, are used to represent the probability distribution function.

As discussed above, one or more performance estimate models can be precalculated in advance of any compilation of any user designs. Many different performance estimate models can be precalculated for use with different design goals and/or with different compilation phases. The resulting performance estimate models can then be included with the compilation system and used to compile any number of user designs. For example, a first timing estimate model can be created for use with a synthesis phase to estimate the timing of a user design following the placement and routing phases. A second timing estimate model can be created for use with a placement phase to estimate the timing of a user design following a subsequent routing phase. The performance estimate models can use a different sets of design characteristics that reflect the distinguishing design characteristics at different compilation phases. Furthermore, the number of compilations needed for an adequate statistical sample of performance values will typically decrease when creating performance estimate models intended for use with later compilation phases, due to the decreased variability in performance values as more portions of the user design configuration are determined.

Figure 5:
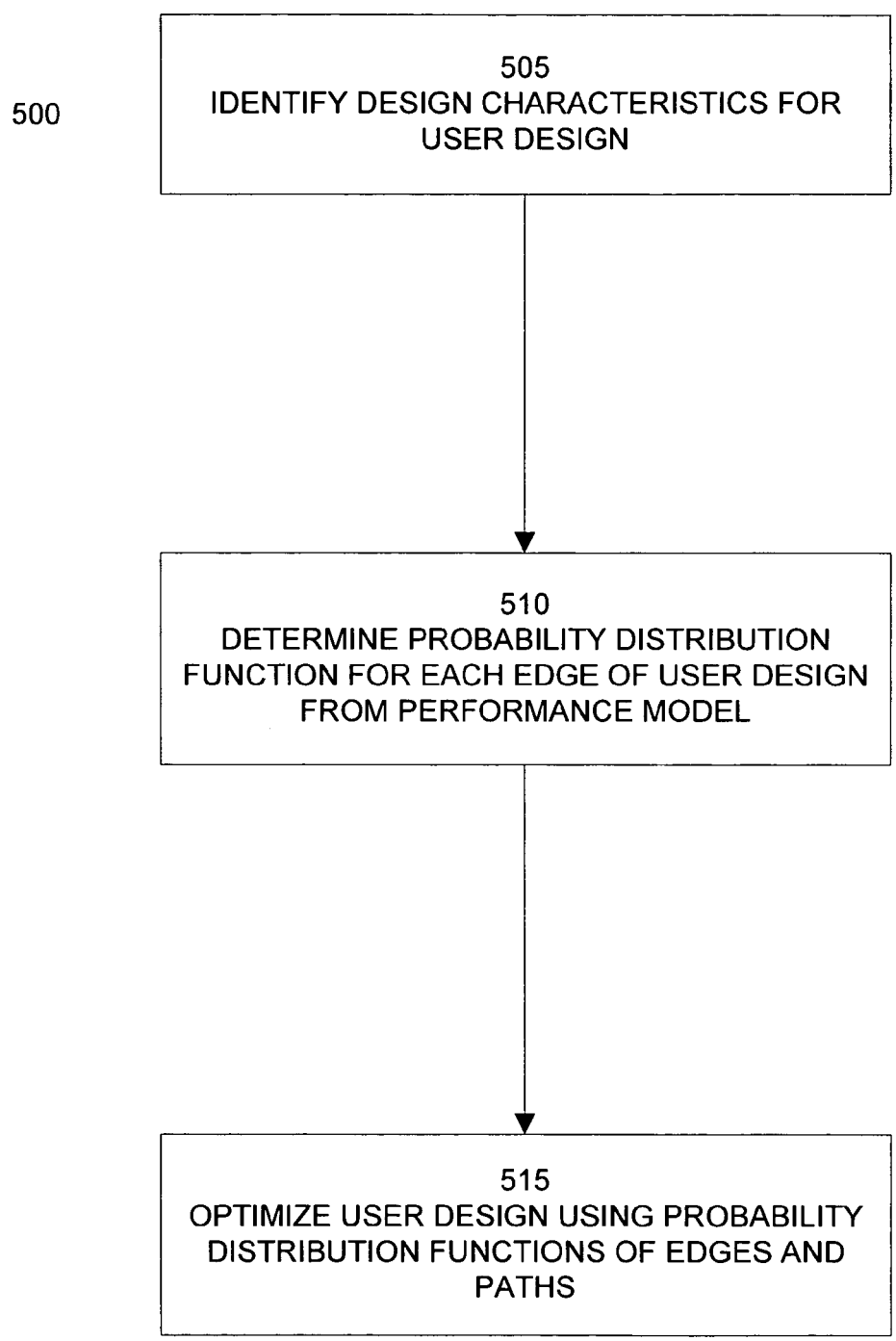
FIG. 5 is a flowchart illustrating a method of applying a performance model to a user design to estimate its performance following subsequent compilation phases according to an embodiment of the invention.

FIG. 5 is a flowchart illustrating a method 500 of applying a performance model to a user design to estimate its performance following subsequent compilation phases according to an embodiment of the invention. Step 505 determines the values of design characteristics of the user design. As discussed in step 315 above, an embodiment of step 505 classifies the user design using the same design characteristics as that used to classify each of the set of sample designs. In another embodiment, step 505 estimates the value of one or more design characteristics to save time, rather than determining its exact value. In another embodiment, step 505 uses one or more different design characteristics to classify the user design in place of the value of a corresponding design characteristic used to classify the set of sample designs.

Step 510 determines estimated performance values for each edge of the user design according to the edge's design characteristic values and the estimated performance model previously created. In an embodiment, all or a portion of the set of design characteristics associated with an edge are inputs to a function, such as linear or non-linear expression, that outputs a performance value. For example, if an edge of a user design has design characteristics (a,b,c) representing attributes of the user design, the path including the edge, and the edge itself, respectively, then the performance estimate model may be expressed as $P=k1*a+k2*b+k3*c$, with coefficients k1, k2, and k3 determined as described in step 420, such as through a linear regression analysis. The output of the performance estimate model can be a single value or a probability distribution function. Performance estimate models can include any number of design characteristics and any number of coefficients, and can be expressed as linear or non-linear expressions. Steps 505 and 510 can be repeated to determine performance estimate values for multiple design goals for the edges of the user design.

Step 520 optimizes the user design in accordance with the performance estimate values associated with the edges of the user design. Some compilation phases require performance estimate values for each path, rather than individual edges. In an embodiment, all or a portion of step 520 combines performance estimate values for all of the edges along each path of the user design, either by summing their associated performance estimate values or convolving their associated probability distribution functions. An example of this is illustrated in FIG. 7, discussed above. In an embodiment, method 500 is built into a compilation phase. Alternatively, method 500 can be utilized by any type of compilation phase that accepts performance value data from an external module. In a further embodiment, the compilation phase supplies an external module either with a user design or the values of the set of design characteristics for all or a portion of the user design. The external module then returns the corresponding estimated performance values.

Although method 500 is described with reference to a single type of performance value to be used by a single compilation phase, steps 505 and 510 can be used to evaluate multiple performance estimate models for different design goals, either with the same or different sets of design characteristics.

In a further embodiment, method 500 can be extended to determine a set of performance estimate values associated with the design goals for each edge, path, and/or portion of the user design. For example, the set of performance estimate values for a path can represent the path's estimated timing, power consumption, and area or resource usage. Using the sets of performance estimate values for the edges, paths, and other portions of the user design provided by method 500, the compilation phase can determine the most critical design goals for the different parts of the user design and optimize these parts accordingly.

For example, if the design goals associated with a user design include a timing goal, a power consumption goal, and an area goal, an embodiment of method 500 can apply one or more performance estimate models to determine a set of performance estimate values (or ranges of values) for timing, power, and area associated with each path of the user design. Based on the design goals and the paths' sets of performance estimate values, a compilation phase can elect to optimize a first portion of paths of the user design for timing, a second portion of the paths of the user design for power consumption, and a third portion of the paths of the user design for area or resource usage.

Figure 6:
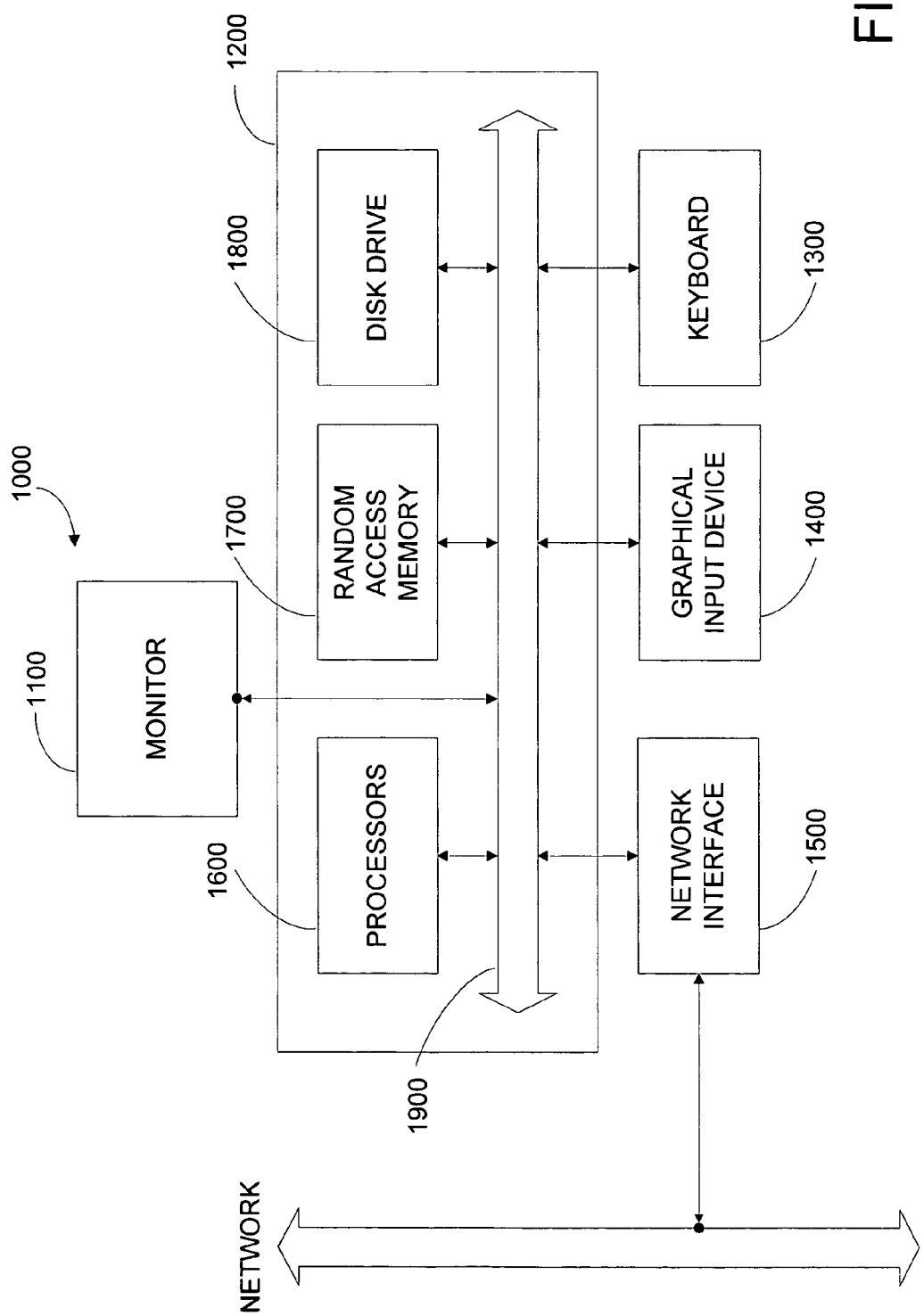
FIG. 6 illustrates an example computer system capable of implementing an embodiment of the invention.

FIG. 6 illustrates an example computer system 1000 capable of implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention. Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Further embodiments can be envisioned to one of ordinary skill in the art after reading the attached documents. For example, although the invention has been discussed with reference to programmable devices, it is equally applicable to logic minimization applications used to design any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method of estimating performance characteristics of a configuration of a circuit, wherein the configured circuit implements a user design, the method comprising:
    for each of one or more sample designs:
        selecting design characteristics of the sample design;
        determining values for the design characteristics;
        for each of a plurality of respective compilation phases performed for the sample design having the same determined values for the design characteristics, a compilation providing a configuration for a placement of logic of the sample design on the circuit to implement the sample design:
            receiving one or more performance values for one or more performance characteristics of the respective configuration of the circuit;
    determining, with a computer system for designing circuits, a performance estimate model from the values for the selected design characteristics and a performance metric of the received performance values associated with each sample design, wherein the performance estimate model accounts for a random variability of values of the performance metric following a subsequent compilation phase in a compilation process that determines a configuration of the circuit to implement the user design; and
    providing the performance estimate module to a user, wherein the performance estimation module is adapted to receive a representation of at least a portion of the user design and to output a probability distribution function of performance values in response to values for design characteristics of the user design.

2. The method of claim 1, wherein determining a performance estimate model comprises:
    compiling the sample designs using the compilation process;
    analyzing the performance metric values of the sample designs;
    determining a relationship between the sample designs' values for the design characteristics and for the performance metric.

3. The method of claim 2, wherein determining a relationship comprises:
    performing a regression analysis of the sample designs' values for the design characteristics and for the performance metric.

4. The method of claim 1, wherein the probability distribution function includes a mean and a standard deviation.

5. The method of claim 1, wherein the design characteristics include an attribute of the entire user design.

6. The method of claim 1, wherein the design characteristics include an attribute of a path of the user design.

7. The method of claim 1, wherein the design characteristics include an attribute of an edge of the user design, wherein the edge comprises a connection between nodes of a path.

8. The method of claim 1, wherein the performance estimation module is adapted to output the probability distribution function of performance metric values to a compilation phase.

9. The method of claim 1, wherein the performance metric values include timing delay.

10. The method of claim 1, wherein the performance metric values include power consumption.

11. The method of claim 1, wherein the performance metric values include device resource usage.

12. The method of claim 1, wherein the performance estimate model is determined by performing a plurality of compilation phases on each sample design to obtain the performance values for the performance characteristics of respective configurations of the circuit, each compilation phase for a sample design utilizing a different input random seed value.

13. The method of claim 1, wherein one of the sample designs is the user design.

14. The method of claim 1, wherein for each of another plurality of respective compilation phases performed for at least one additional sample design having other determined values for the design characteristics:

receiving additional performance values for respective configurations of the circuit implementing the additional sample design.

15. The method of claim 1, wherein at least a portion of the performance values that are from respective compilation phases and that correspond to a same performance characteristic have different values.

16. An computer readable medium comprising:
performance estimate model data specifying a probability distribution function of performance metric values of a configuration of a circuit that implements a logic design in response to an input of values for design characteristics of the logic design,
wherein the probability distribution function includes an effect of a random variability of the values of the performance metric following a subsequent compilation phase in a compilation process that determines a configuration of the circuit to implement the logic design; and
a plurality of instructions adapted to direct an information processing device to perform an operation comprising:
receiving a user design from a user;
determining values of the user design's design characteristics; and
determining at least one probability distribution function of performance metric values for at least a portion of the user design using the performance estimate model data and the values of the user design's design characteristics.

17. The computer readable medium of claim 16, wherein the plurality of instructions further comprises:
receiving performance metric values of a performance analysis of a compiled version of the user design; and
updating the performance estimate model data with the values of the user design's design characteristics and the performance metric values of the compiled version of the user design.

18. The computer readable medium of claim 16, wherein the performance metric values include timing delay.

19. The computer readable medium of claim 16, wherein the probability distribution function includes a mean and a standard deviation.

20. The computer readable medium of claim 16, wherein the performance metric values include power consumption.

21. The computer readable of claim 16, wherein the performance metric values include device resource usage.

22. The computer readable medium of claim 16, wherein the design characteristics include an attribute of the entire user design.

23. The computer readable medium of claim 16, wherein the design characteristics include an attribute of a path of the user design.

24. The computer readable medium of claim 16, wherein the design characteristics include an attribute of an edge of the user design, wherein the edge comprises a connection between nodes of a path.

25. The computer readable medium of claim 16, wherein the performance estimate model is determined by performing a plurality of compilations on each of a plurality of sample designs, each compilation utilizing a different random seed value.

26. A method of estimating performance characteristics of a user design, the method comprising:
for each of one or more sample designs:
selecting design characteristics of the sample design;
determining values for the design characteristics;
for each of a plurality of respective compilation phases:
receiving one or more performance values for one or more performance characteristics associated with a respective configuration implementing the user design;
determining, with a computer system for designing circuits, a performance estimate model from values for the selected design characteristics and a performance metric of the received performance values associated with each sample design; and
providing the performance estimate module to a user, wherein the performance estimation module is adapted to receive a representation of at least a portion of the user design and to output a probability distribution function of performance values in response to values for design characteristics of the user design.

* * * * *

UNITED STATES PATENT AND TRADEMARK OFFICE
CERTIFICATE OF CORRECTION

PATENT NO.         : 7,577,929 B1
APPLICATION NO. : 11/187722
DATED              : August 18, 2009
INVENTOR(S)        : Hutton et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 637 days.

Signed and Sealed this

Seventh Day of September, 2010

David J. Kappos
*Director of the United States Patent and Trademark Office*